(12) United States Patent
Lin et al.

(10) Patent No.: US 12,363,910 B2
(45) Date of Patent: Jul. 15, 2025

(54) THREE-DIMENSIONAL MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 169 days.

(21) Appl. No.: 18/446,894

(22) Filed: Aug. 9, 2023

(65) Prior Publication Data

US 2023/0389327 A1 Nov. 30, 2023

Related U.S. Application Data

(62) Division of application No. 17/458,677, filed on Aug. 27, 2021, now Pat. No. 11,980,035.

(Continued)

(51) Int. Cl.
*H10B 51/20* (2023.01)
*H10B 51/10* (2023.01)
*H10B 51/30* (2023.01)

(52) U.S. Cl.
CPC ............. *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS 9,698,156 B2 7/2017 Lue
10,833,103 B2 * 11/2020 Sakuma ................. H10B 43/27
(Continued)

FOREIGN PATENT DOCUMENTS

CN 110520990 A * 11/2019 ........... H01L 23/528
CN 111146206 A * 5/2020 ..... H01L 21/823412
(Continued)

*Primary Examiner* — Matthew E Warren
(74) *Attorney, Agent, or Firm* — FOLEY & LARDNER LLP

(57) ABSTRACT

A semiconductor device includes a first conductor structure extending along a lateral direction. The semiconductor device includes a first memory film that extends along a vertical direction and is in contact with the first conductor structure. The semiconductor device includes a first semiconductor film that extends along the vertical direction and is in contact with the first memory film. Ends of the first semiconductor film align with ends of the first memory film, respectively. The semiconductor device includes a second conductor structure extending along the vertical direction. The semiconductor device includes a third conductor structure extending along the vertical direction. The semiconductor device includes a fourth conductor structure extending along the vertical direction. The second and fourth conductor structures are coupled to the ends of the first semiconductor film, and the third conductor structure is coupled to a portion of the first semiconductor film between its ends.

20 Claims, 15 Drawing Sheets

Related U.S. Application Data

(60) Provisional application No. 63/156,771, filed on Mar. 4, 2021.

(56) References Cited

U.S. PATENT DOCUMENTS

| | | |
|---|---|---|
| 2020/0026990 A1 | 1/2020 | Lue |
| 2020/0051990 A1 | 2/2020 | Harari et al. |
| 2020/0203427 A1* | 6/2020 | Noh ..................... H10B 63/84 |
| 2022/0037363 A1* | 2/2022 | Jiang .................... H10B 43/10 |

FOREIGN PATENT DOCUMENTS

| | | | | |
|---|---|---|---|---|
| KR | 101938502 B1 * | 1/2019 | ............ | H10D 30/63 |
| KR | 20220010027 A | 1/2022 | | |
| TW | 1718077 B * | 2/2021 | ............ | H10B 51/20 |

\* cited by examiner

THREE-DIMENSIONAL MEMORY DEVICES AND METHODS OF MANUFACTURING THEREOF

CROSS-REFERENCE TO RELATED APPLICATION

This application is a divisional of U.S. patent application Ser. No. 17/458,677 filed Aug. 27, 2021, which claims priority to and the benefit of U.S. Provisional Application No. 63/156,771, filed Mar. 4, 2021, which are incorporated herein by reference in their entireties for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
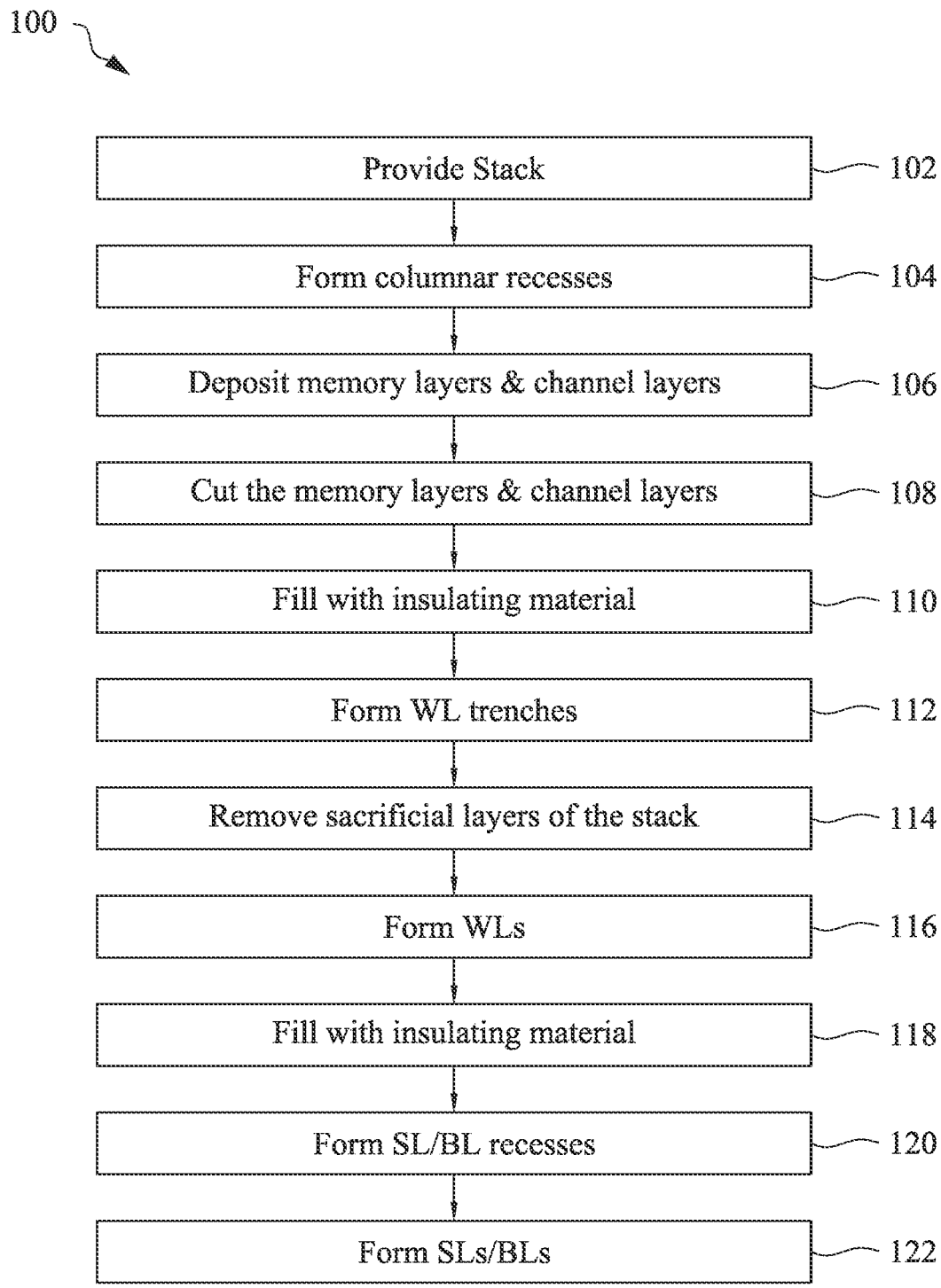
FIG. 1 illustrates a flow chart of an example method for making a three-dimensional memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, there are two main classes of components in complementary metal oxide semiconductor (CMOS) integrated circuits (ICs), namely transistors and wires. With "scaling," transistor performance and density typically improve, which can contribute to the increases in IC performance and functionality. However, wires (interconnects) that connect together transistors degrade in performance with such scaling. The situation is typically that wires can contribute a major portion of the performance, functionality and power consumption of ICs. Three-dimensional (3D) stacking of semiconductor devices or chips is one avenue to tackle the wire issues. By arranging transistors in 3 dimensions instead of 2 dimensions, the transistors in ICs can be placed closer to each other. This reduces wire lengths and keeps wiring delay low.

For example, a 3D memory device in which memory cells are stacked in a vertical direction over a substrate have been proposed. In general, such a 3D memory device includes a number of memory cells arranged in respective layers/levels (sometimes referred to as a memory string). The memory cells in the different layers share a same channel, which can be formed in a macaroni shape. However, in existing 3D memory devices, a density of the memory cells in each layer (e.g., the 2D density) is generally limited. As such, to further increase the total (3D) density of the memory device, a number of the layers is forced to increase, which can cause various fabrication issues. For example, when the number of layers increase, the aspect ratios of various interconnect structures of the 3D memory device (e.g., bit line (BLs), source lines (SLs)) need to increase accordingly, which can impose significant fabrication challenge. Thus, the existing 3D memory devices have not been entirely satisfactory in every aspect.

Embodiments of the present disclosure are discussed in the context of forming a semiconductor device, and particularly in the context of forming a 3D memory device. The 3D memory device, as disclosed herein, includes a stack of memory levels that each have an extended number of memory cells. For example, each memory level of the disclosed 3D memory device includes at least four memory cells. Two of these four memory cells can share a first discrete portion of a channel film, while the other two memory cells can share a second discrete portion of the same channel film. Further, all four memory cells can be individually accessed (e.g., read, written) through a common source line (SL) and two bit lines (BLs). When compared to the existing 3D memory devices (as mentioned above), the disclosed 3D memory device can have at least a four times greater density at each memory level (i.e., at least 4×2D density). Thus, without undesirably increasing the number of memory levels, a total density of the disclosed 3D memory device can still be significantly increased.

FIG. 1 illustrates a flowchart of a method 100 to form a memory device, according to one or more embodiments of the present disclosure. For example, at least some of the operations (or steps) of the method 100 can be used to form a three-dimensional (3D) memory device having a number of memory strings laterally separated from each other, each of the memory strings having a number of memory layers vertically arranged on top of one another, and each of the memory layers having a number of memory cells operatively isolated from each other.

It is noted that the method 100 is merely an example, and is not intended to limit the present disclosure. Accordingly, it should be understood that additional operations may be provided before, during, and after the method 100 of FIG. 1, and that some other operations may only be briefly described herein. In some embodiments, operations of the method 100 may be associated with perspective views of an example 3D memory device at various fabrication stages as shown in FIGS. 2, 3, 4, 5, 6, 7, 8, 9, 10, 11, and 12, respectively, which will be discussed in further detail below.

In brief overview, the method 100 starts with operation 102 of providing a stack of insulating layers and sacrificial layers over a substrate. The method 100 continues to operation 104 of forming a number of columnar recesses. The method 100 continues to operation 106 of depositing a number of memory layers and a number of channel layers. The method 100 continues to operation 108 of cutting each of the memory layers and the channel layers. The method 100 continues to operation 110 of filling with an insulating material. The method 100 continues to operation 112 of forming a number of word line (WL) trenches. The method 100 continues to operation 114 of removing the sacrificial layers of the stack. The method 100 continues to operation 116 of forming a number of WLs. The method 100 continues to operation 118 of filling with the insulating material. The method 100 continues to operation 120 of forming a number of bit line (BL) recesses and a number of source/select line (SL) recesses. The method 100 continues to operation 122 of forming a number of BLs and a number of SLs.

Figure 2:
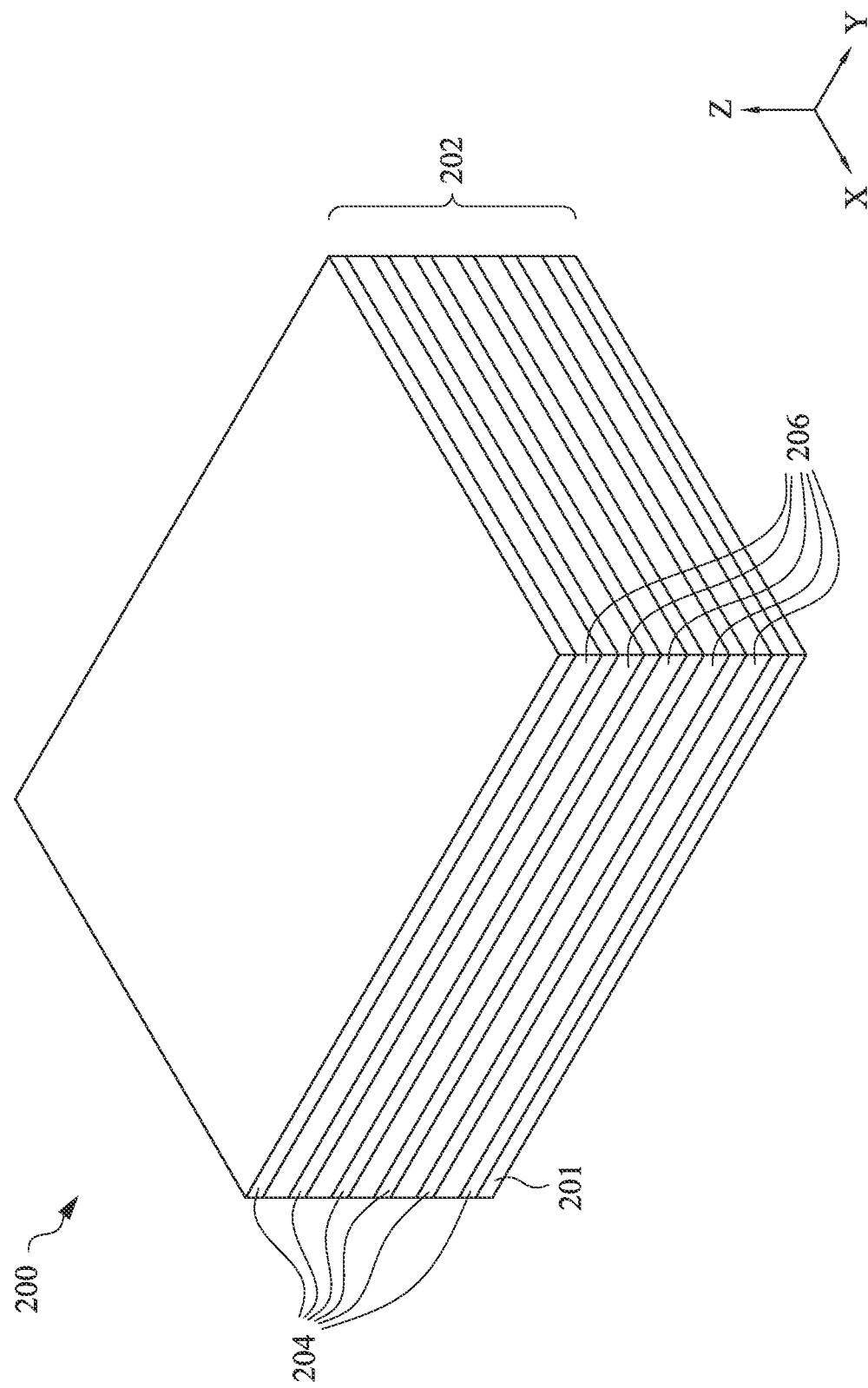
FIGS. 2, 3, 4, 5, 6, 7, 8, 9, 10, 11, and 12 each illustrate a perspective view of an example three-dimensional memory device during various fabrication stages, made by the method of FIG. 1, in accordance with some embodiments.

Corresponding to operation 102 of FIG. 1, FIG. 2 is a perspective view of the 3D memory device 200 including a stack 202 formed over a semiconductor substrate 201 at one of the various stages of fabrication, in accordance with various embodiments.

The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GainAs, GainP, and/or GainAsP; or combinations thereof. Other materials are within the scope of the present disclosure.

The stack 202 includes a number of insulating layers 204 and a number of sacrificial layers 206 alternately stacked on top of one another over the substrate 201 along a vertical direction (e.g., the Z direction). Although six insulating layers 204 and five sacrificial layers 206 are shown in the illustrated embodiments of FIG. 2, it should be understood that the stack 202 can include any number of insulating layers and any number of sacrificial layers alternately disposed on top of one another, while remaining within the scope of the present disclosure.

Further, although the stack 202 directly contacts the substrate 201 in the illustrated embodiment of FIG. 2, it should be understood that the stack 202 may be separated from a top surface of the substrate 201. For example, a number of (planar and/or non-planar) transistors may be formed over the substrate 201, and a number of metallization layers, each of which includes a number of contacts electrically connecting to those transistors, may be formed between the substrate 201 and the stack 202. As used herein, the alternately stacked insulating layers 204 and sacrificial layers 206 may refer to each of the sacrificial layers 206 being adjoined by two adjacent insulating layers 204. The insulating layers 204 may have the same thickness thereamongst, or may have different thicknesses. The sacrificial layers 206 may have the same thickness thereamongst, or may have different thicknesses. In some embodiments, the stack 202 may begin with the insulating layer 204 (as shown in FIG. 2) or the sacrificial layer 206 (in some other embodiments).

The insulating layers 204 can include at least one insulating material. The insulating materials that can be employed for the insulating layer 204 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. In one embodiment, the insulating layers 204 include silicon oxide.

The sacrificial layers 206 may include an insulating material, a semiconductor material, or a conductive material. The material of the sacrificial layers 206 is a sacrificial material that can be subsequently removed selective to the material of the insulating layers 204. Non-limiting examples of the sacrificial layers 206 include silicon nitride, an amorphous semiconductor material (such as amorphous silicon), and a polycrystalline semiconductor material (such as polysilicon). In one embodiment, the sacrificial layers 206 can be spacer material layers that include silicon nitride or a semiconductor material including at least one of silicon or germanium. Other materials are within the scope of the present disclosure.

The stack 202 can be formed by alternately depositing the respective materials of the insulating layers 204 and sacrificial layers 206 over the substrate 201. In some embodiments, one of the insulating layers 204 can be deposited, for example, by chemical vapor deposition (CVD), followed by depositing such as, for example, using CVD or atomic layer deposition (ALD), one of the sacrificial layers 206. Other methods of forming the stack 202 are within the scope of the present disclosure.

Figure 3:
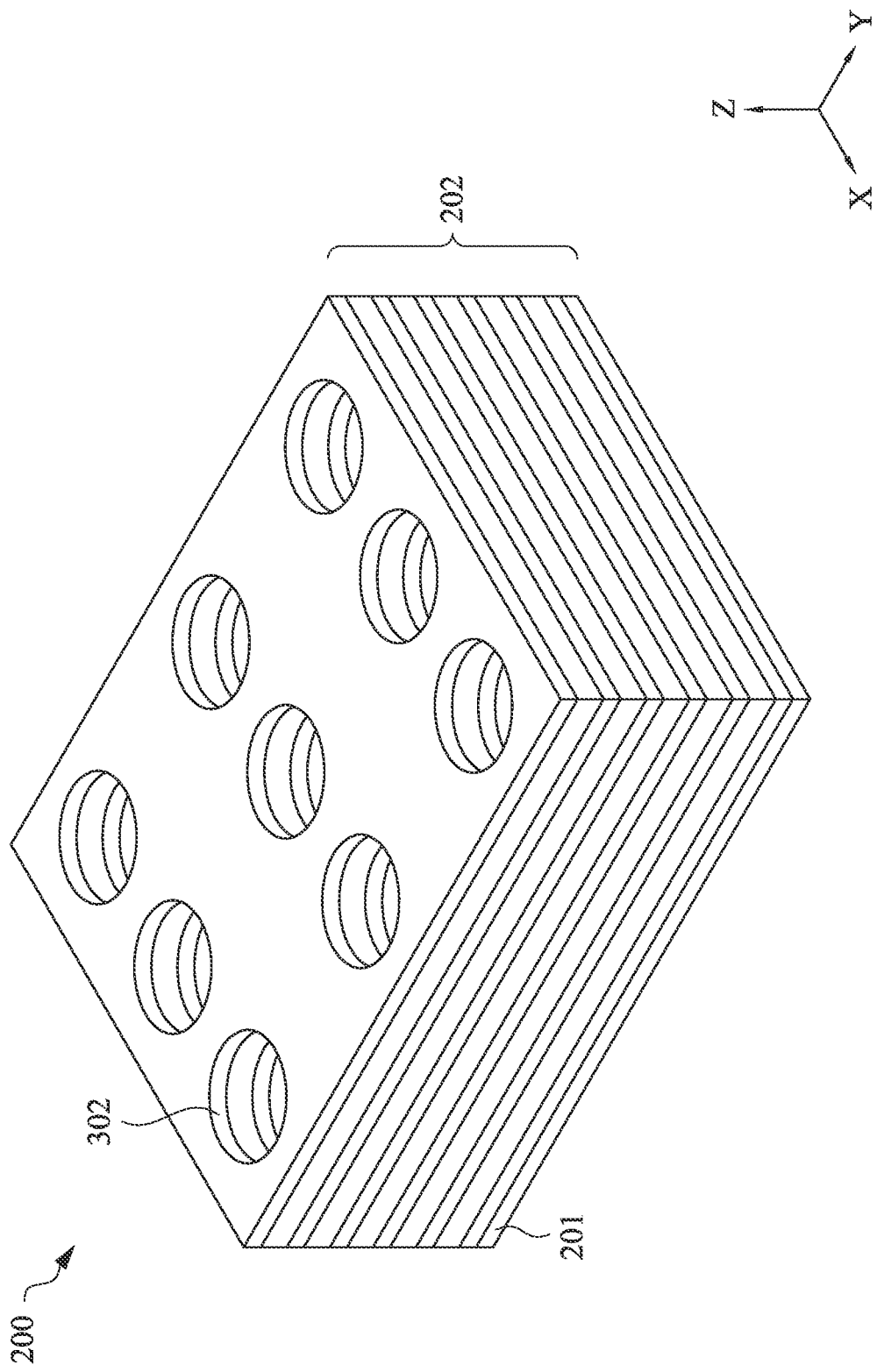

Corresponding to operation 104 of FIG. 1, FIG. 3 is a perspective view of the 3D memory device 200 including a number of columnar recesses 302 at one of the various stages of fabrication, in accordance with various embodiments.

Laterally, the columnar recesses 302 are separated from one another. For example, none of the columnar recesses 302 may merge or otherwise contact with another one of the columnar recesses 302, when viewed from the top. Vertically, each of the columnar recesses 302 penetrates through the stack 202. For example, the columnar recesses 302 may each penetrate through stack 202 (from the bottommost to the topmost insulating layers 204). In some other embodiments, the columnar recesses 302 may partially extend across the stack 202. In the illustrated embodiment of FIG. 2, the columnar recesses 302 are each formed in a cylindrical shape, where the columnar recess 302 has a circle shape when viewed from the top. However, it should be understood that the columnar recess 302 can have any of various other shapes, while remaining within the scope of the present disclosure. For example, the columnar recess 302 can have an oval shape, a rectangle shape, or a rhombus shape (when viewed from the stop), as will be discussed with respect to FIGS. 14A, 14B, 14C, 14D, and 14E.

Figure 4:
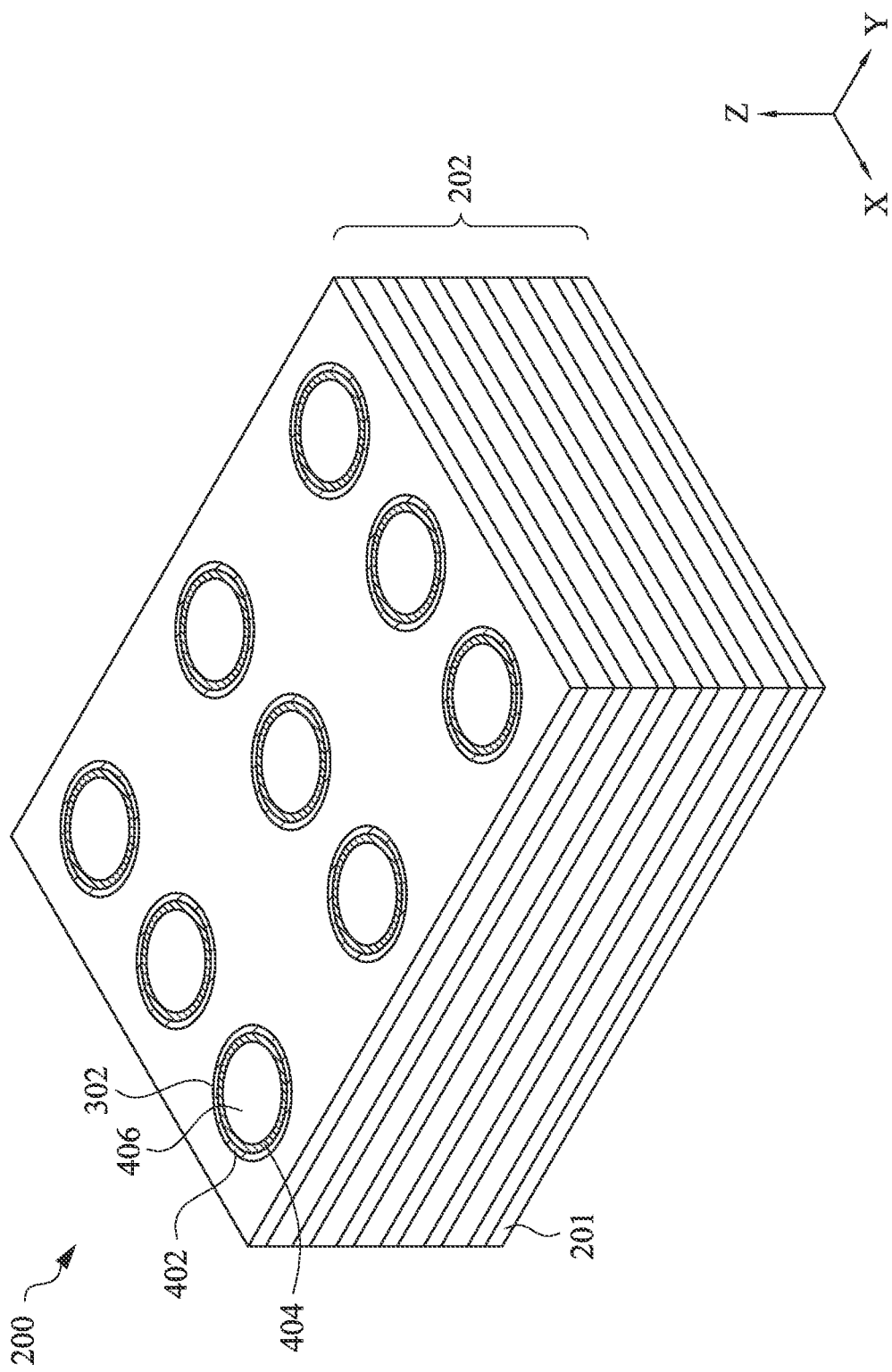

Corresponding to operation 106 of FIG. 1, FIG. 4 is a perspective view of the 3D memory device 200 including a number of memory layers 402 and a number of channel layers 404 in the columnar recesses 302 at one of the various stages of fabrication, in accordance with various embodiments.

As shown, in each of the columnar recesses 302, a memory layer 402 is (e.g., conformally and radially) formed along an inner sidewall of the columnar recess 302, and a channel layer 404 is (e.g., conformally and radially) formed along an inner sidewall of the memory layer 402. As such, each of the memory layer 402 and channel layer 404 is formed as a tube structure that extends along the Z direction. In some embodiments, each of the memory layer 402 and channel layer 404 may be formed a closed-end layer, when viewed from the top. Alternatively stated, each of the memory layer 402 and channel layer 404 has no open end along the X and Y directions. In some embodiments, the memory layer 402 and channel layer 404 may not fully fill the columnar recess 302. After the formation of the memory layer 402 and channel layer 404, the columnar recess 302 may be filled with an insulating material layer 406 (e.g., having a material similar as the material of the insulating layers 204), followed by a chemical mechanical polishing (CMP) process.

The memory layer 402 may include a ferroelectric material such as, for example, lead zirconate titanate (PZT), PbZr/TiO$_3$, BaTiO$_3$, PbTiO$_2$, or combinations thereof, in one of various embodiments. However, it should be understood that the memory layer 402 can include any of various other materials that are suitable as in memory devices, while remaining within the scope of the present disclosure. For example, the memory layer 402 can include a material selected from the group consisting of: HfO$_2$, Hr$_{1-x}$Zr$_x$O$_2$, ZrO$_2$, TiO$_2$, NiO, TaO$_x$, Cu$_2$O, Nb$_2$O$_5$, AlO$_x$, and combinations thereof. Following the formation of columnar recesses 302, a blanket memory layer 402 can be deposited over the workpiece as a continuous liner structure, for example, by a conformal deposition method such as atomic layer deposition (ALD) or chemical vapor deposition (CVD). Other deposition methods are within the scope of the present disclosure.

The channel layer 404 may include a doped or undoped semiconductor material such as, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. Following the deposition of the blanket memory layer 402, a blanket channel layer 404 can be deposited over the workpiece as a continuous liner structure, for example, by a conformal deposition method such as atomic layer deposition (ALD) or chemical vapor deposition (CVD). Other deposition methods are within the scope of the present disclosure. Next, a blanket insulating layer 406 is deposited over the workpiece to fill the columnar recesses 302, followed by a CMP process, which can self-align the memory layer 402, the channel layer 404, and the insulating layer 406 in each of the columnar recess 302.

Figure 5:
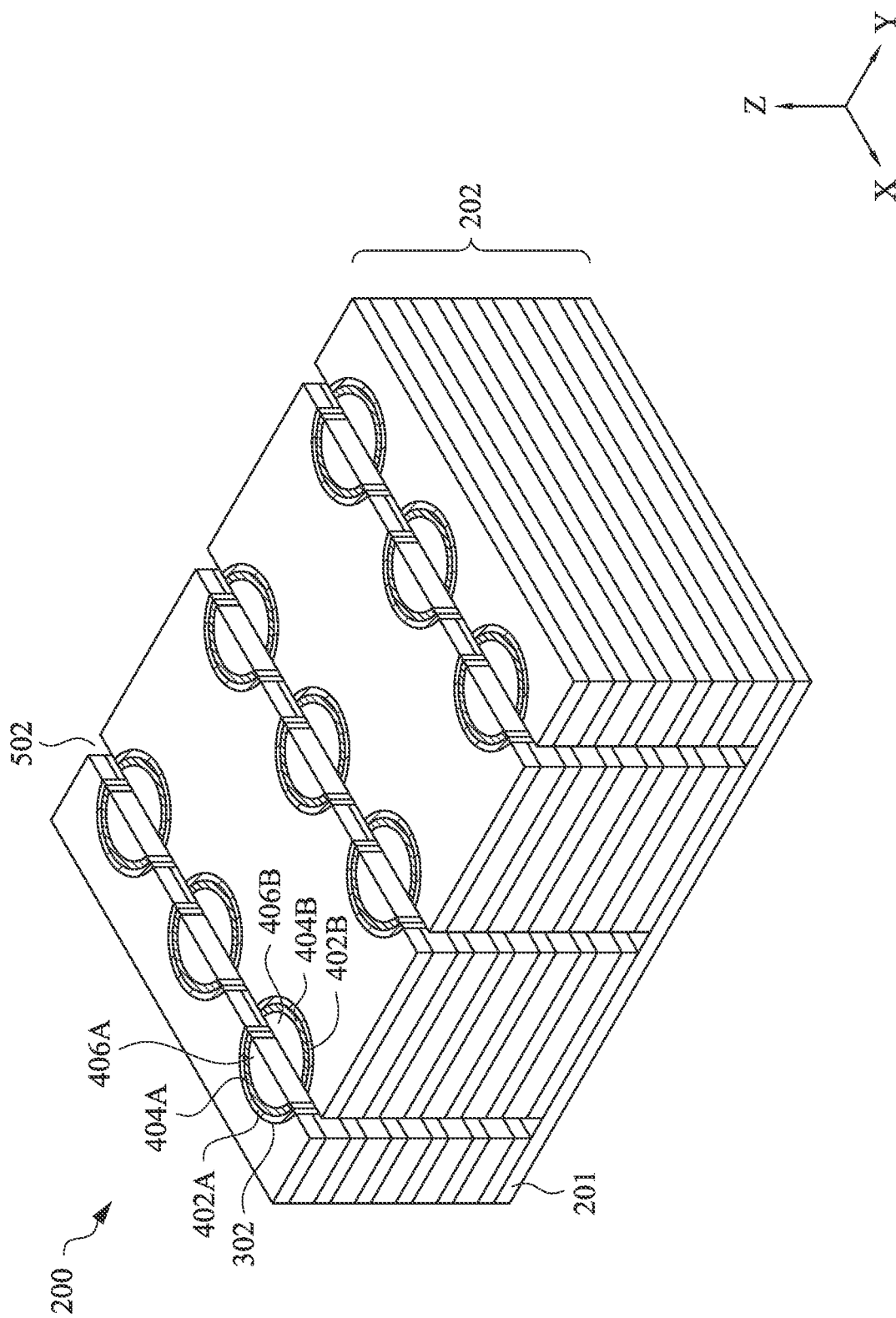

Corresponding to operation 108 of FIG. 1, FIG. 5 is a perspective view of the 3D memory device 200 in which the memory layer 402, the channel layer 404, and the insulating layer 406 in each columnar recess 302 are cut at one of the various stages of fabrication, in accordance with various embodiments.

Upon filling each of the columnar recesses 302 with the memory layer, channel layer, and the insulating layer, a number of trenches 502 can be formed to cut or otherwise separate the memory layer 402, the channel layer 404, and the insulating layer 406 in each columnar recess 302. For example in FIG. 5, the trench 502 is formed to extend in the Z direction and also in the X direction. Further, the trench 502 can be formed across a middle portion of the columnar recess 302 (e.g., along a diameter of the memory layer 402, the channel layer 404, and the insulating layer 406 in each columnar recess 302). As such, each trench 502 can separate the memory layer 402, the channel layer 404, and the insulating layer 406 in one or more of the columnar recesses 302 into respective two separate portions.

As a representative example in FIG. 5, the memory layer 402, the channel layer 404, and the insulating layer 406 in one of the columnar recesses 302 are cut or separated into portions 402A and 402B, 404A and 404B, 406A and 406B, respectively. The separated or cut portions of the memory layer 402 may sometimes be referred to as cut memory layers (segments or otherwise films) 402A and 402B, respectively, and the separated or cut portions of the channel layer 404 may sometimes be referred to as cut channel layers (segments or otherwise films) 404A and 404B, respectively. Depending on a lengthwise direction of the trench 502, the separated portions of each of the memory layer 402, the channel layer 404, and the insulating layer 406 are located on opposite sides of the trench 502 along a direction perpendicular to the lengthwise direction of the trench 502. For example, the trench 502 extends along the X direction, which can cause the portions of each of the memory layer 402, channel layer 404, and insulating layer 406 to be on the opposite sides of the trench 502 along the Y direction.

The trench 502 can be formed by using an etching process over the workpiece. For example, a patterned mask layer (not shown) can be formed over the workpiece that exposes at least the middle portion of each of the filled columnar recesses 302, and the etching process is performed to form the trench 502. The etching process may include, for example, a reactive ion etch (RIE) process, a neutral beam etch (NBE) process, the like, or combinations thereof. The etching process may be anisotropic, which allows the trenches 502 to have almost vertical inner sidewalls.

Figure 6:
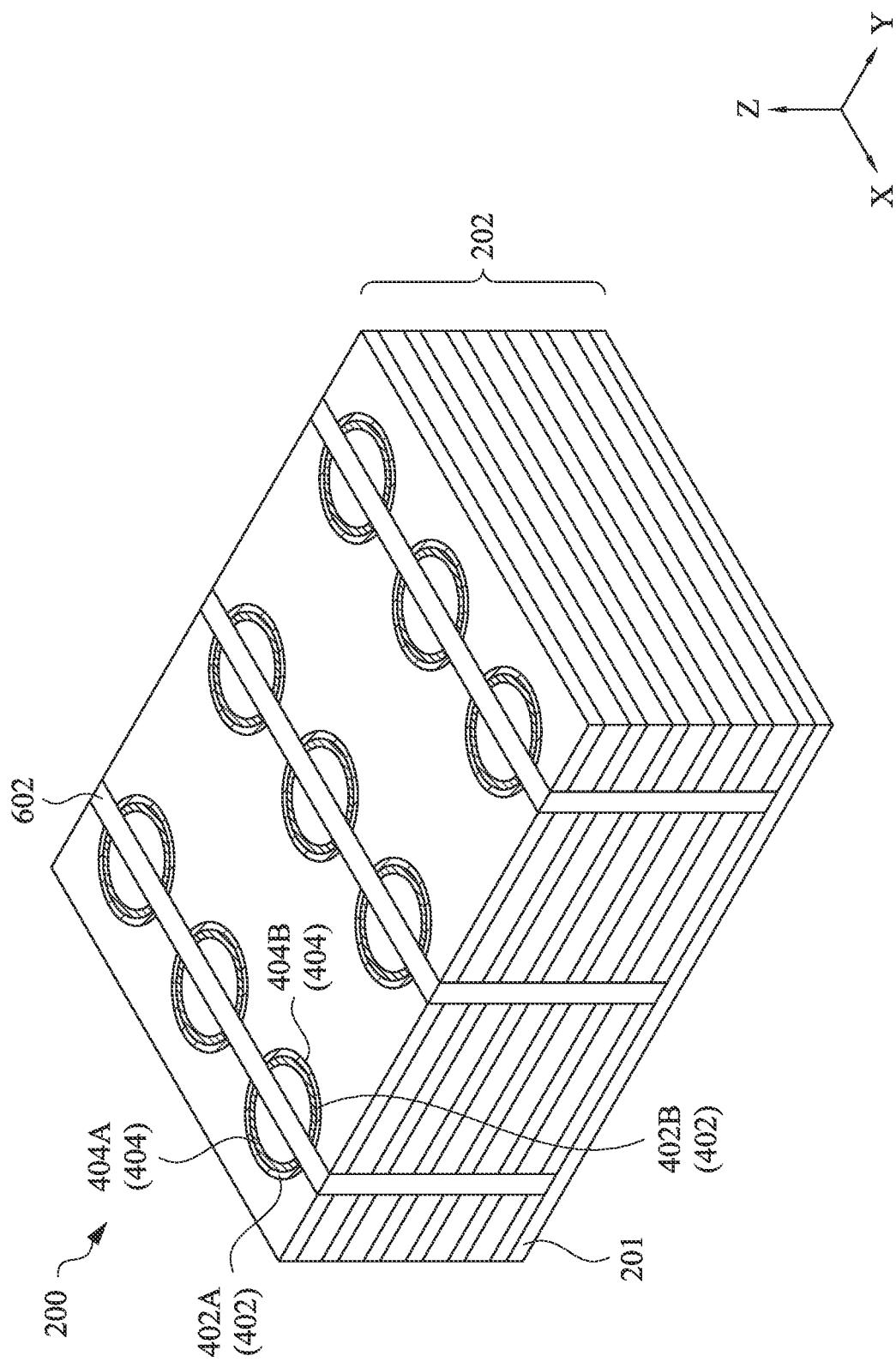

Corresponding to operation 110 of FIG. 1, FIG. 6 is a perspective view of the 3D memory device 200 including an insulating layer 602 at one of the various stages of fabrication, in accordance with various embodiments.

In some embodiments, the insulating layer 602 (e.g., having a material similar as the material of the insulating layers 204 and the insulating layer 406) can fill the trench 502. As such, the insulating layer 602 can electrically isolate the cut portions of each of the memory layer 402 and the channel layer 404. For example in FIG. 6, the insulating layer 602 can electrically isolate the cut the memory layers, 402A and 402B, and electrically isolate the cut channel layers, 404A and 404B. Further, by filling the trench 502 with the insulating layer 602, both (open) ends of each of the cut memory/channel layers, 402A, 404A, 402B, and 404B, can be in contact with the insulating layer 602. The insulating layer 602 can be formed, for example, by a deposition method such as atomic layer deposition (ALD) or chemical vapor deposition (CVD) with the above-mentioned insulating material. Next, a CMP process can be performed to planarized the insulating material to form the insulating layer 602, as shown in FIG. 6.

Figure 7:
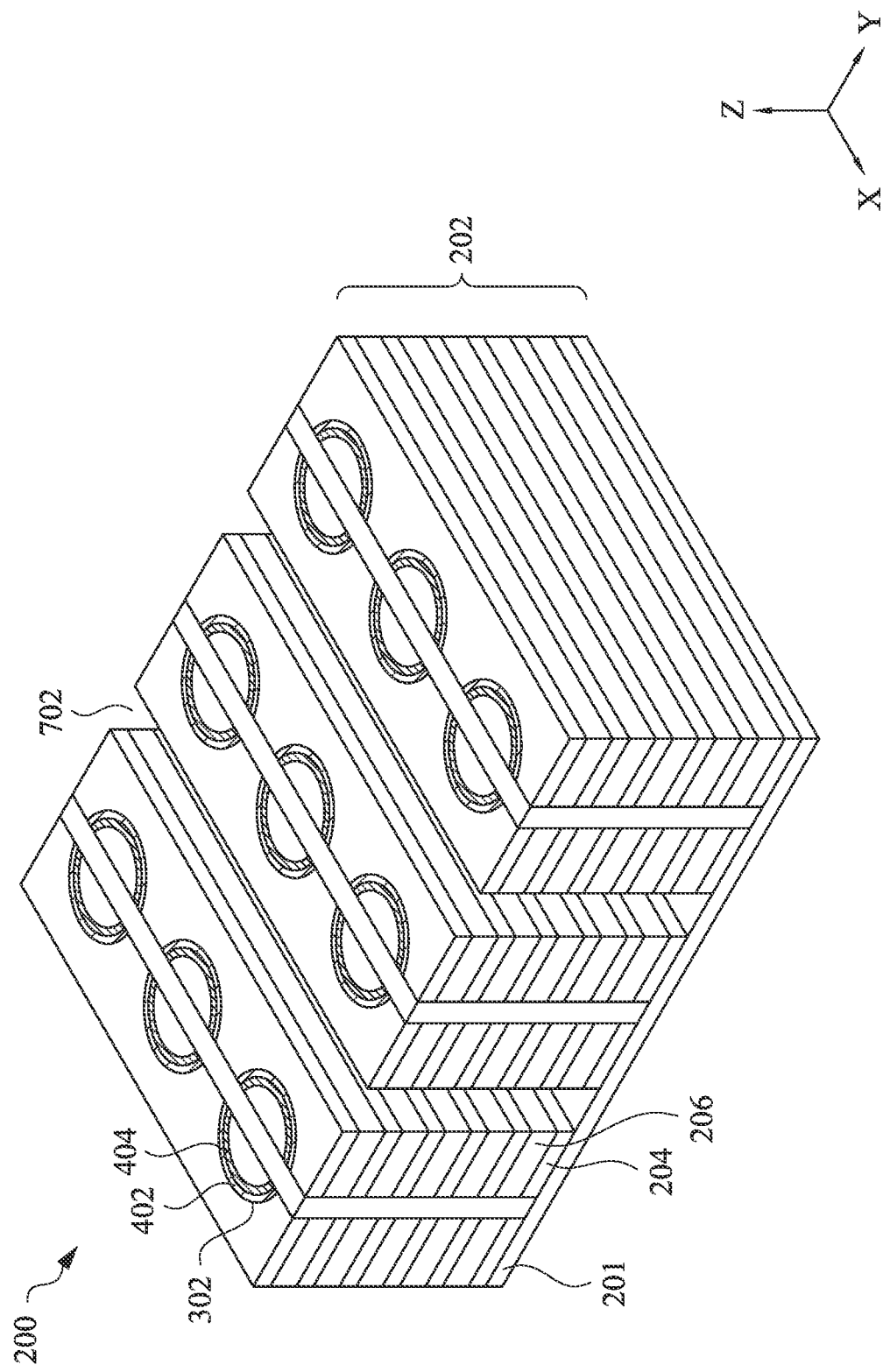

Corresponding to operation 112 of FIG. 1, FIG. 7 is a perspective view of the 3D memory device 200 including a number of WL trenches 702 at one of the various stages of fabrication, in accordance with various embodiments.

In some embodiments, the WL trenches 702, extending in a first direction, may be formed between different groups of columnar recesses 302 that are separated apart along a second direction perpendicular to the first direction. As shown, the WL trench 702, upon being formed, can separate a first group of filled columnar recess 302 (disposed along the X direction) and a second group of filled columnar recess 302 (disposed along the X direction) along the Y direction. Further, upon forming the WL trench 702, respective sidewalls of remaining portions of the insulating layers 204 and sacrificial layers 206 can be exposed. In some embodiments, such remaining insulating layers 204 and sacrificial layers 206 are disposed between one of the WL trenches 702 and the memory layers 402.

The WL trenches 702 can be formed by using an etching process over the workpiece. For example, a patterned mask layer (not shown) can be formed over the workpiece that exposes the portions of the insulating layer 204 between adjacent columnar recesses 302, and the etching process is performed to form the WL trenches 702. The etching process may include, for example, a reactive ion etch (RIE) process, a neutral beam etch (NBE) process, the like, or combinations thereof. The etching process may be anisotropic, which allows the WL trenches 702 to each have almost vertical inner sidewalls.

Figure 8:
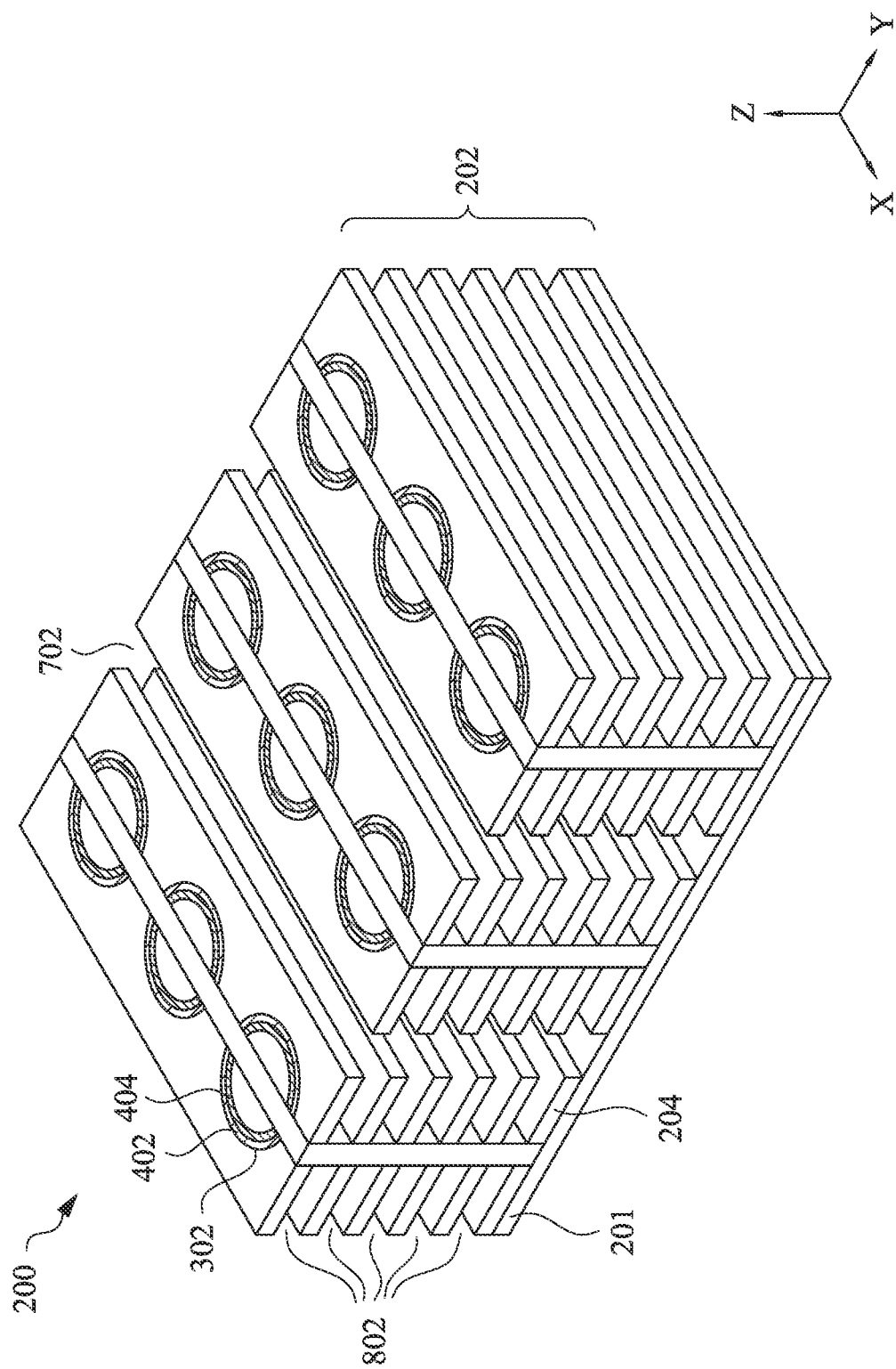

Corresponding to operation 114 of FIG. 1, FIG. 8 is a perspective view of the 3D memory device 200 in which the sacrificial layers 206 are removed at one of the various stages of fabrication, in accordance with various embodiments.

As shown, each of the (remaining) sacrificial layers 206 of the stack 202 may be recessed (e.g., removed) laterally to form a number of recesses 802, in place of the sacrificial layers 206. The sacrificial layers 206 can be recessed by performing an etching process (sometimes referred to as a pull-back process) through the WL trenches 702 that etches the sacrificial layers 206 selective to the insulating layers 204. Alternatively stated, the insulating layers 204 may remain substantially intact throughout the etching process. As such, the WL trenches 702 (after the pull-back process) can each include its inner sidewalls present in a mace-like profile (e.g., extending with the recesses 802 that each extend into between adjacent ones of the insulating layers 204). Such laterally extending recesses 802 can expose different portions of each of the memory layers 402 arranged along the Z direction, as shown in FIG. 8.

The pull-back process can include a wet etching process employing a wet etch solution, or can be a gas phase (dry) etching process in which the etchant is introduced in a vapor phase into the WL trenches 702. In the example where the sacrificial layers 206 include silicon nitride and the insulating layers 204 include silicon oxide, the pull-back process can include a wet etching process in which the workpiece is immersed within a wet etch tank that includes phosphoric acid ($H_3PO_4$), which etches silicon nitride of the sacrificial layer 206 selective to silicon oxide and various other materials of the insulating layers 204. Other methods of etching the sacrificial layer 206 are within the scope of the present disclosure.

Figure 9:
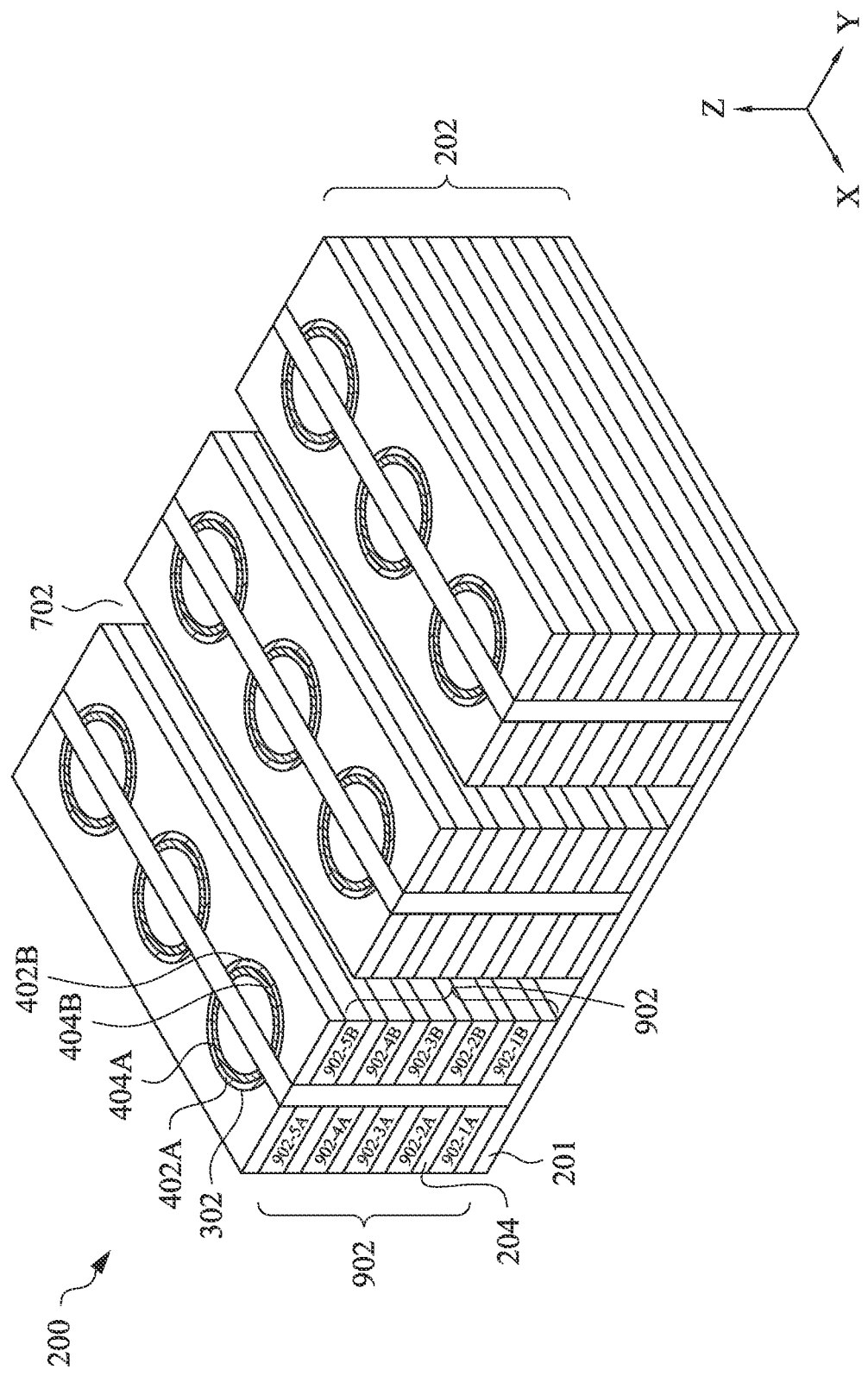

Corresponding to operation 116 of FIG. 1, FIG. 9 is a perspective view of the 3D memory device 200 including a number of WLs 902 at one of the various stages of fabrication, in accordance with various embodiments.

The WLs 902 can be formed by filling the recesses 802 with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The WLs 902 can be formed by overlaying the workpiece with the above-listed metal material by, for example, chemical vapor deposition (CVD), physical vapor deposition (PVD), electroless plating, electroplating, or combinations thereof. This can be followed by an etching back process to remove the excess metal material in the WL trenches 702. Other methods of forming the WLs 902 are within the scope of the present disclosure.

The WLs 902, extending along a lateral direction (e.g., along the X direction), can each couple to a number of (vertically spaced) portions of the cut channel layer 404 through a number of (vertically spaced) portions of the cut memory layer 402, respectively. For example in FIG. 10, WL 902-1A can operatively (e.g., electrically) couple to a number of portions of the cut channel layer 404A through corresponding portions of the cut memory layer 402A; WL 902-2A can operatively (e.g., electrically) couple to a number of portions of the cut channel layer 404A through corresponding portions of the cut memory layer 402A; WL 902-3A can operatively (e.g., electrically) couple to a number of portions of the cut channel layer 404A through corresponding portions of the cut memory layer 402A; WL 902-4A can operatively (e.g., electrically) couple to a number of portions of the cut channel layer 404A through corresponding portions of the cut memory layer 402A; and WL 902-5A can operatively (e.g., electrically) couple to a number of portions of the cut channel layer 404A through corresponding portions of the cut memory layer 402A.

Similarly, WL 902-1B can operatively (e.g., electrically) couple to a number of portions of the cut channel layer 404B through corresponding portions of the cut memory layer 402B; WL 902-2B can operatively (e.g., electrically) couple to a number of portions of the cut channel layer 404B through corresponding portions of the cut memory layer 402B; WL 902-3B can operatively (e.g., electrically) couple to a number of portions of the cut channel layer 404B through corresponding portions of the cut memory layer 402B; WL 902-4B can operatively (e.g., electrically) couple to a number of portions of the cut channel layer 404B through corresponding portions of the cut memory layer 402B; and WL 902-5B can operatively (e.g., electrically) couple to a number of portions of the cut channel layer 404B through corresponding portions of the cut memory layer 402B.

As will be discussed below, each of the WLs 902 can gate a number of memory cells at each level. For example, the WL 902-1A can gate the memory cells formed by the cut memory layer 402A and cut channel layer 404A in each of the columnar recesses 302 separated apart along the X direction; and the WL 902-1B (at the same level as the WL 902-1A) can gate the memory cells formed by the cut memory layer 402B and cut channel layer 404B in each of the columnar recesses 302 separated apart along the X direction. In some embodiments, such a level that includes plural WLs with the corresponding gated memory cells may sometimes be referred to as a memory level.

For example, the WLs 902-1A and 902-1B may be referred to as being disposed in a first memory level (which can include any number of WLs); the WLs 902-2A and 902-2B may be referred to as being disposed in a second memory level (which can include any number of WLs); the WLs 902-3A and 902-3B may be referred to as being disposed in a third memory level (which can include any number of WLs); the WLs 902-4A and 902-4B may be referred to as being disposed in a fourth memory level (which can include any number of WLs); and the WLs 902-5A and 902-5B may be referred to as being disposed in a fifth memory level (which can include any number of WLs). The WLs in different memory levels can be electrically isolated from one another with the interposed insulating layer 204, in some embodiments.

Figure 10:
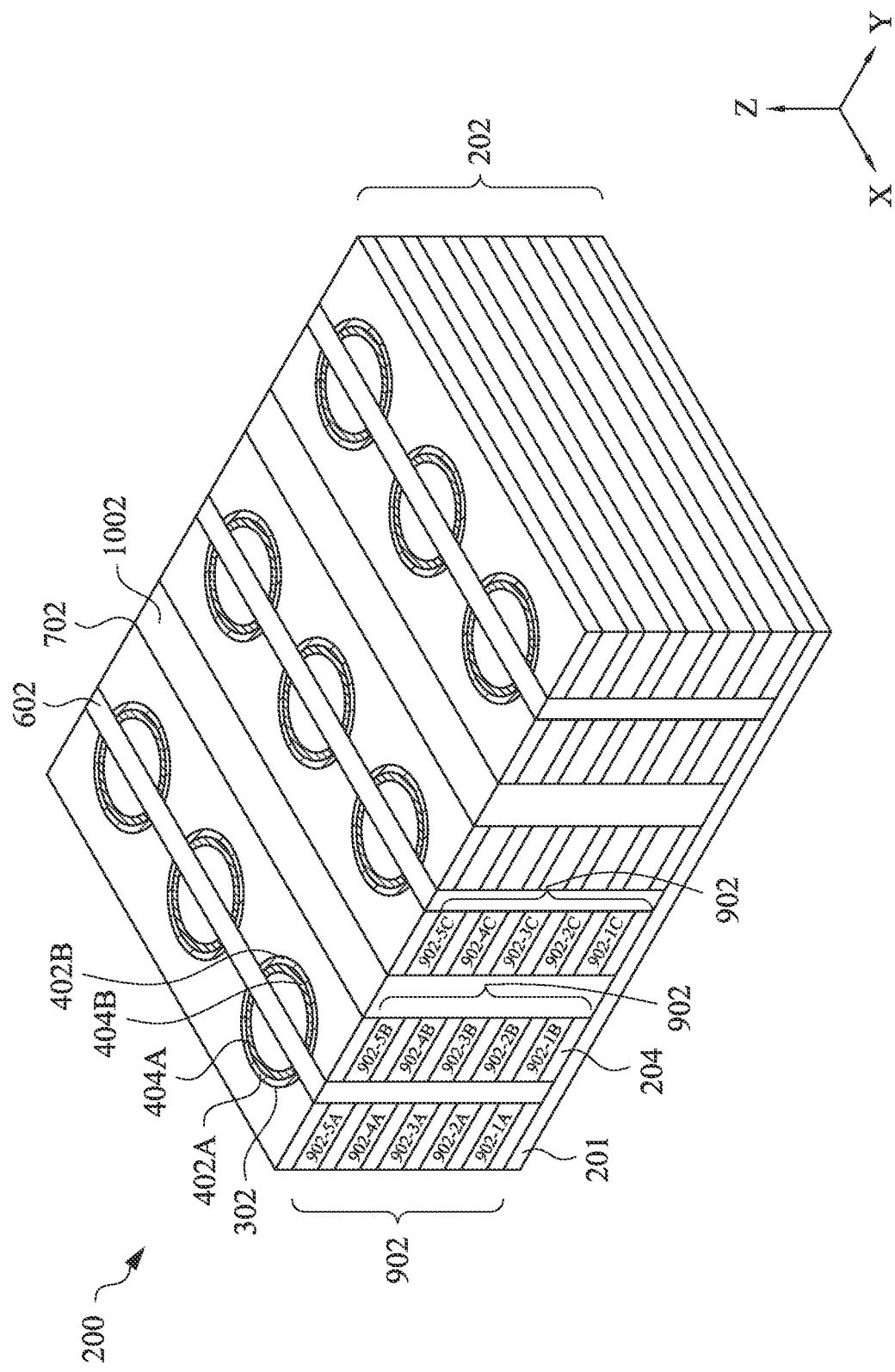

Corresponding to operation 118 of FIG. 1, FIG. 10 is a perspective view of the 3D memory device 200 including an insulating layer 1002 at one of the various stages of fabrication, in accordance with various embodiments.

In some embodiments, the insulating layer 1002 (e.g., having a material similar as the material of the insulating layers 204, 406, and 602) can fill each of the WL trenches 702. As such, the insulating layer 1002 can electrically isolate different groups of the WLs 902 on its opposite sides, and the insulating layer 602 can also electrically isolate different groups of the WLs 902 on its opposite sides. For example in FIG. 10, the insulating layer 602 can electrically isolation the WLs 902-1A through 902-5A from the WLs 902-1B through 902-5B, and the insulating layer 1002 can electrically isolation the WLs 902-1B through 902-5B from the WLs 902-1C through 902-5C. The insulating layer 1002 can be formed, for example, by a deposition method such as atomic layer deposition (ALD) or chemical vapor deposition (CVD) with the above-mentioned insulating material. Next, a CMP process can be performed to planarized the insulating material to form the insulating layer 1002, as shown in FIG. 10.

Figure 11:
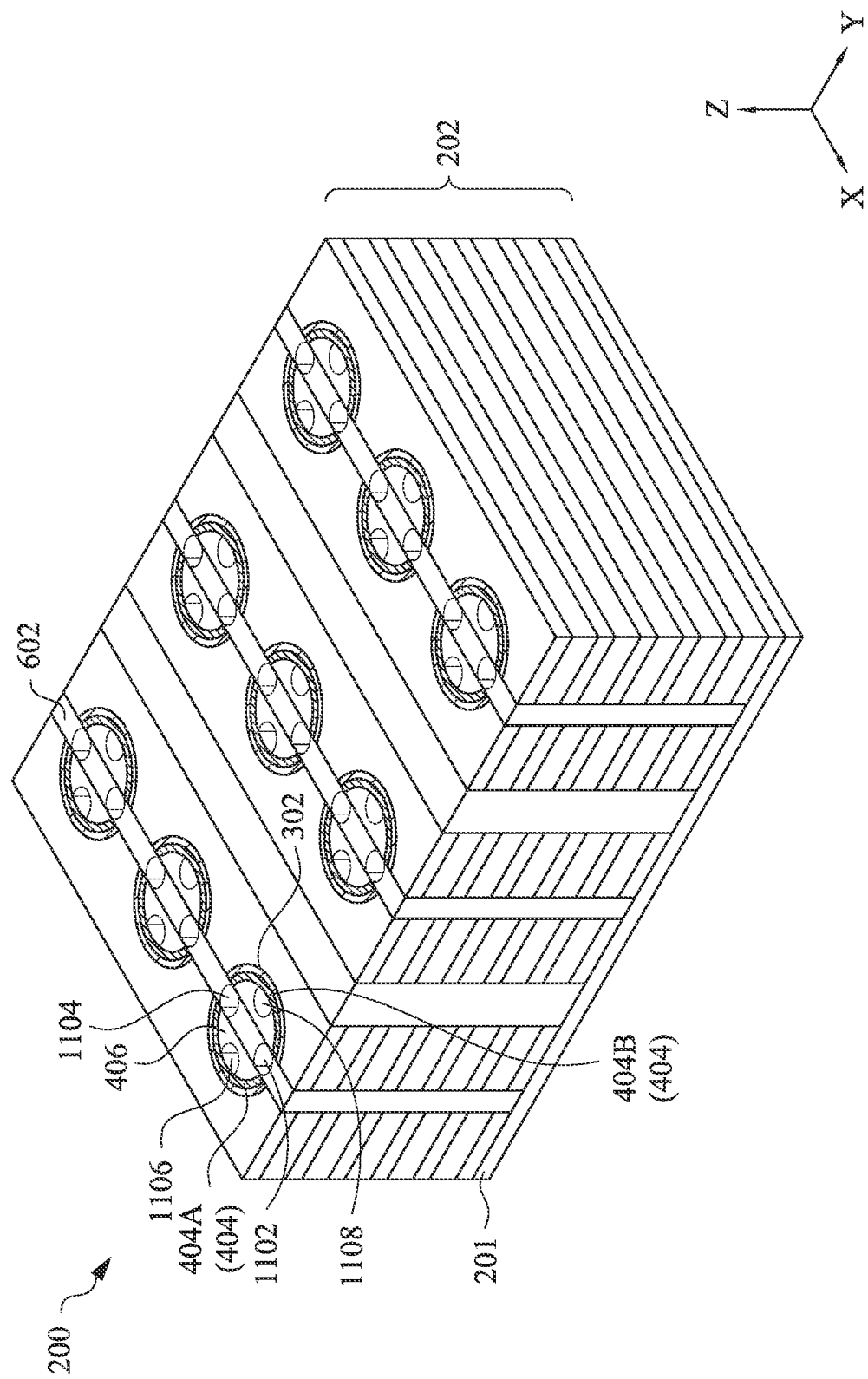

Corresponding to operation 120 of FIG. 1, FIG. 11 is a perspective view of the 3D memory device 200 including a number of BL recesses, 1102 and 1104, and a number of SL recesses, 1106 and 1108, in each columnar recess 302 at one of the various stages of fabrication, in accordance with various embodiments.

The BL recesses 1102 and 1104 are formed by etching respective different portions of the insulating layer 602. In some embodiments, the BL recesses 1102 and 1104 may be formed with a large enough dimension to again expose the ends of the cut channel layers 404. For example in FIG. 11, the BL recess 1102, upon being formed, can expose one end of the cut channel layer 404A and one end of the cut channel layer 404B; and the BL recess 1104, upon being formed, can expose the other end of the cut channel layer 404A and the other end of the cut channel layer 404B. Each of the BL recesses 1102 and 1104 may penetrate through the stack 202. In the illustrated embodiment of FIG. 11, the BL recesses 1102 and 1104 are each formed in a cylindrical shape, where the BL recesses 1102 and 1104 have a circle-based shape with a portion cut out by the cut channel layer, when viewed from the top. However, it should be understood that the BL recesses 1102 and 1104 can have any of various other shapes, while remaining within the scope of the present disclosure. For example, the BL recesses 1102 and 1104 can have an oval-based shape, a rectangle-based shape, or a rhombus-based shape (when viewed from the stop).

The SL recesses 1106 and 1108 are formed by etching respective different portions of the insulating layer 406. Further, the SL recesses 1106 and 1108 may be formed to align with each other along the Y direction, allowing them to be connected to each other by a common interconnect structure, which will be discussed below. In some embodiments, each of the SL recesses 1106 and 1108 may be formed to expose a middle portion of the cut channel layer. For example in FIG. 11, the SL recess 1106, upon being formed, can expose a middle portion of the cut channel layer 404A; and the SL recess 1108, upon being formed, can expose a middle portion of the cut channel layer 404B. Each of the SL recesses 1106 and 1108 may penetrate through the stack 202. In the illustrated embodiment of FIG. 11, the SL recesses 1106 and 1108 are each formed in a cylindrical shape, where the SL recesses 1106 and 1108 have a circle-based shape with a portion cut out by the cut channel layer, when viewed from the top. However, it should be understood that the SL recesses 1106 and 1108 can have any of various other shapes, while remaining within the scope of the present disclosure. For example, the SL recesses 1106 and 1108 can have an oval-based shape, a rectangle-based shape, or a rhombus-based shape (when viewed from the stop).

Figure 12:
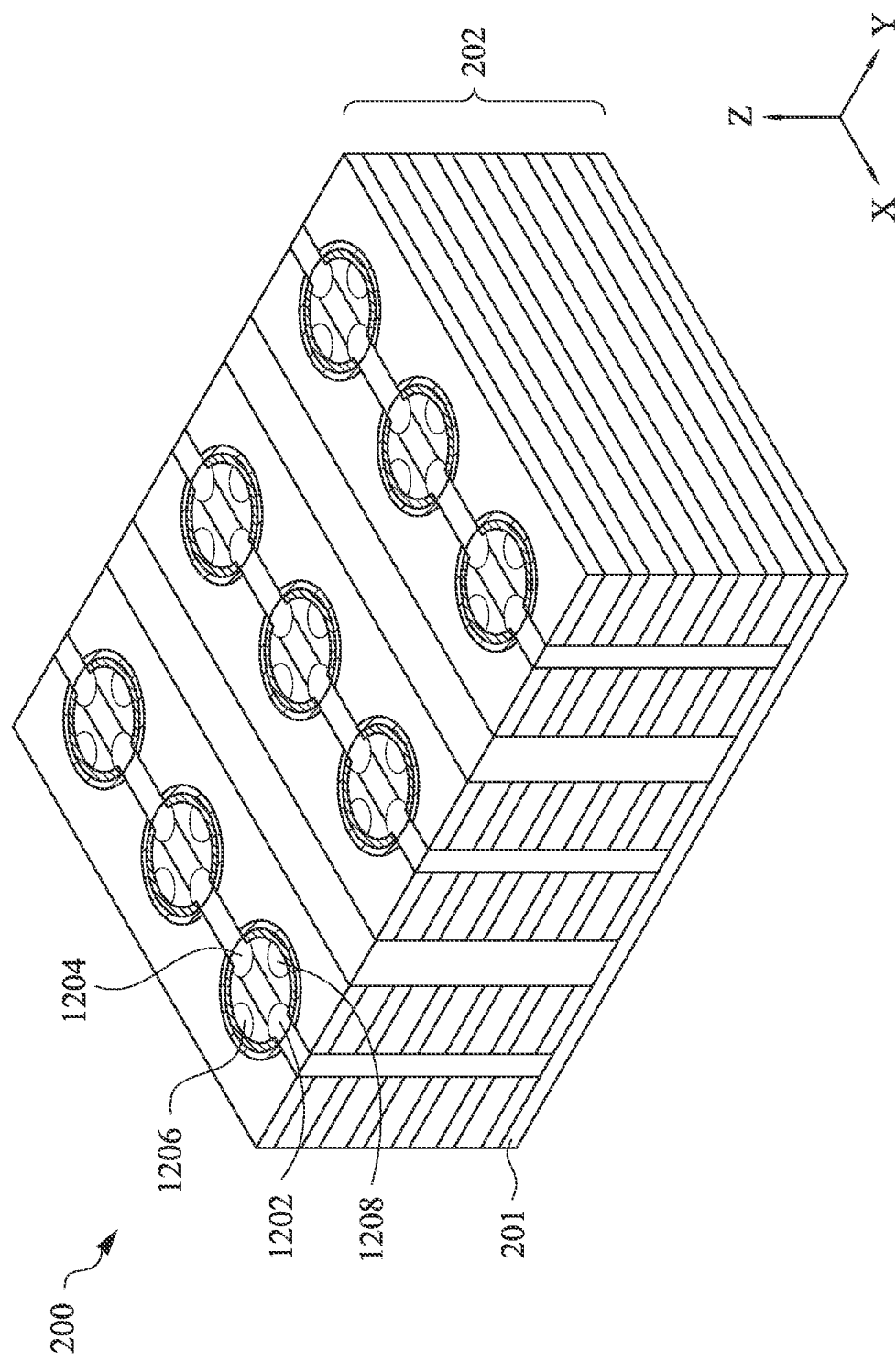

Corresponding to operation 122 of FIG. 1, FIG. 12 is a perspective view of the 3D memory device 200 including a number of BLs, 1202 and 1204, and a number of SLs, 1206 and 1208, in each columnar recess 302 at one of the various stages of fabrication, in accordance with various embodiments.

The BLs 1202 and 1204 can be formed by filling the BL recesses 1102 and 1104, respectively, with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the BLs 1202 and 1204 can be formed by filling the BL recesses 1102 and 1104, respectively, with a semiconductor material. Non-limiting examples of such a semiconductor material include Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The BLs 1202 and 1204 can be formed by overlaying the workpiece (e.g., to fill the BL recesses) with the above-listed metal or semiconductor material by, for example, chemical vapor deposition (CVD), physical vapor deposition (PVD), electroless plating, electroplating, or combinations thereof. This can be followed by a CMP process. Other methods of forming the BLs are within the scope of the present disclosure.

Similarly, the SLs 1206 and 1208 can be formed by filling the SL recesses 1106 and 1108, respectively, with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the SLs 1206 and 1208 can be formed by filling the SL recesses 1106 and 1108, respectively, with a semiconductor material. Non-limiting examples of such a semiconductor material include Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. Concurrently with forming the BLs, the SLs 1206 and 1208 can be formed by overlaying the workpiece (e.g., to fill the SL recesses) with the above-listed metal or semiconductor material by, for example, chemical vapor deposition (CVD), physical vapor deposition (PVD), electroless plating, electroplating, or combinations thereof. This can be followed by the same CMP process. Other methods of forming the SLs are within the scope of the present disclosure.

Figure 13B:
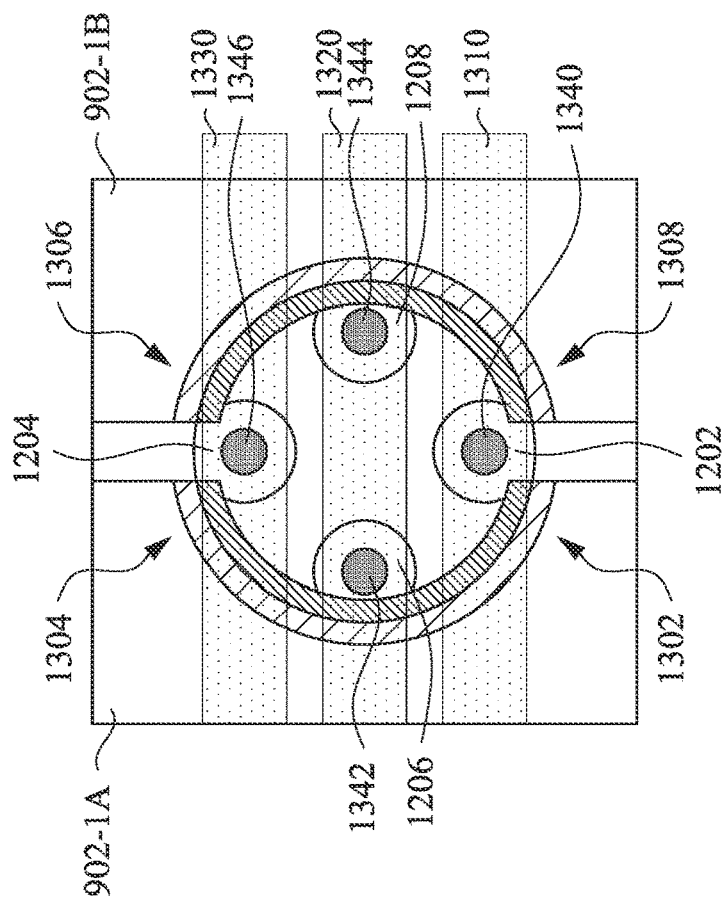
FIGS. 13A and 13B each illustrate a cross-sectional view of the example three-dimensional memory device shown in FIGS. 2-12, in accordance with some embodiments.
Figure 13A:
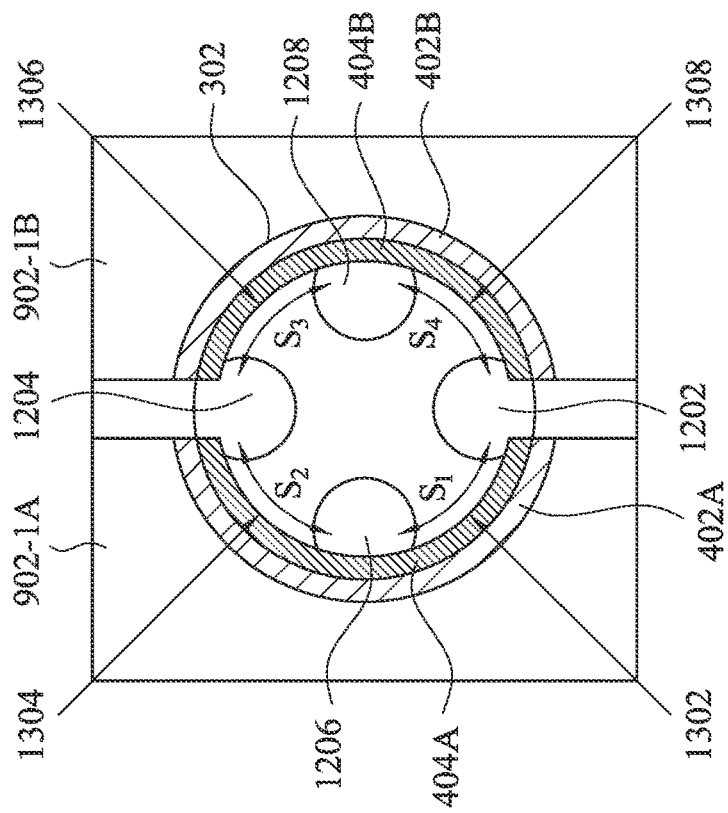

FIG. 13A illustrates a cross-sectional view of a portion of the 3D memory device 200, in accordance with various embodiments. Upon forming the BLs 1202-1204 and SLs 1206-1208, a plural number of memory cells can be defined in each filled columnar recess 302 across the different memory levels. Further, at each memory level, a plural number of memory cells can be defined. Such memory cells vertically arranged on top of one another may sometimes be referred to as a memory string. In FIG. 13A, a portion of the 3D memory device 200 in one of the filled columnar recesses 302 at the first memory level, where the WLs 902-1A and 902-1B are disposed, is shown.

In accordance with various embodiments of the present disclosure, a first memory cell 1302 can be defined by a portion of the cut channel layer 404A (e.g., the lower portion of the cut channel layer 404A with respect to the SL 1206 in FIG. 13A), ends of which are operatively (and physically) coupled to the BL 1202 and SL 1206, respectively. Such a portion of the cut channel layer 404A may function as a channel of the memory cell 1302, with a channel length that be characterized by an arc length, $S_1$. The WL 902-1A can gate such a channel through a portion of the cut memory layer 402A (e.g., the lower portion of the cut memory layer 402A with respect to the SL 1206 in FIG. 13A).

In accordance with various embodiments of the present disclosure, a second memory cell 1304 can be defined by a portion of the cut channel layer 404A (e.g., the upper portion of the cut channel layer 404A with respect to the SL 1206 in FIG. 13A), ends of which are operatively (and physically) coupled to the BL 1204 and SL 1206, respectively. Such a portion of the cut channel layer 404A may function as a channel of the memory cell 1304, with a channel length that be characterized by an arc length, $S_2$. The WL 902-1A can gate such a channel through a portion of the cut memory layer 402A (e.g., the upper portion of the cut memory layer 402A with respect to the SL 1206 in FIG. 13A).

In accordance with various embodiments of the present disclosure, a third memory cell 1306 can be defined by a portion of the cut channel layer 404B (e.g., the upper portion of the cut channel layer 404B with respect to the SL 1208 in FIG. 13A), ends of which are operatively (and physically) coupled to the BL 1204 and SL 1208, respectively. Such a portion of the cut channel layer 404B may function as a channel of the memory cell 1306, with a channel length that be characterized by an arc length, $S_3$. The WL 902-1B can gate such a channel through a portion of the cut memory layer 402B (e.g., the upper portion of the cut memory layer 402B with respect to the SL 1208 in FIG. 13A).

In accordance with various embodiments of the present disclosure, a fourth memory cell 1308 can be defined by a portion of the cut channel layer 404B (e.g., the lower portion of the cut channel layer 404B with respect to the SL 1208 in FIG. 13A), ends of which are operatively (and physically) coupled to the BL 1202 and SL 1208, respectively. Such a portion of the cut channel layer 404B may function as a channel of the memory cell 1308, with a channel length that be characterized by an arc length, $S_4$. The WL 902-1B can gate such a channel through a portion of the cut memory layer 402B (e.g., the lower portion of the cut memory layer 402B with respect to the SL 1208 in FIG. 13A).

To appropriately (e.g., individually) access the memory cells 1302 to 1308, the BL 1202 and 1204 may be electrically coupled to respective different BL interconnect structures, and the SLs 1206 and 1208 may be electrically coupled to a common SL interconnect structure, according to various embodiments. For example in FIG. 13B, the BL 1202 is coupled to a BL interconnect structure 1310 through a via structure 1340; the SLs 1206 and 1208 are coupled to a common SL interconnect structure 1320 through via structures 1342 and 1344, respectively; and the BL 1204 is coupled to a BL interconnect structure 1330 through a via structure 1346. As such, to select one of the memory cells 1302 to 1308 (e.g., for programming, reading, or erasing), voltages respectively applied on the interconnect structures 1310, 1320, and 1330 and WLs 902-1A and 902-1B can follow Table I, as shown below.

TABLE I

| | | | |
|---|---|---|---|
| Memory cell 1302 | WL 902-1A = $V_{WL}$<br>WL 902-1B = 0 | BL interconnect structure 1310 = $V_{BL}$;<br>BL interconnect structure 1330 = 0 | common SL interconnect structure 1320 = 0 |
| Memory cell 1304 | | BL interconnect structure 1310 = 0;<br>BL interconnect structure 1330 = $V_{BL}$ | |
| Memory cell 1306 | WL 902-1B = $V_{WL}$<br>WL 902-1A = 0 | BL interconnect structure 1310 = 0;<br>BL interconnect structure 1330 = $V_{BL}$ | |
| Memory cell 1308 | | BL interconnect structure 1310 = $V_{BL}$;<br>BL interconnect structure 1330 = 0 | |

It should be noted that Table I is directed to operating the memory cells at one of the memory levels. To operate the memory cells at another memory level, the corresponding WL 902 should be applied (or asserted) with an appropriate $V_{WL}$. For example, to access one of the four memory cells at the second memory level that is directly above the memory cell 1302, the WL 902-2A is applied with $V_{WL}$, while the BL interconnect structures 1310 and 1330 can still be applied with $V_{BL}$ and 0 volts, respectively.

FIGS. 14A, 14B, 14C, and 14D illustrate various other profiles of the cut memory layer 402A/402B, the cut channel layer 404A/404B, the BLs 1202/1204, and/or the SLs 1206/1208, in accordance with various embodiments. FIGS. 14A through 14D are each a cross-sectional view of a portion of the 3D memory device 200 that includes four memory cells in one filled columnar column at one memory level.

Figure 14B:
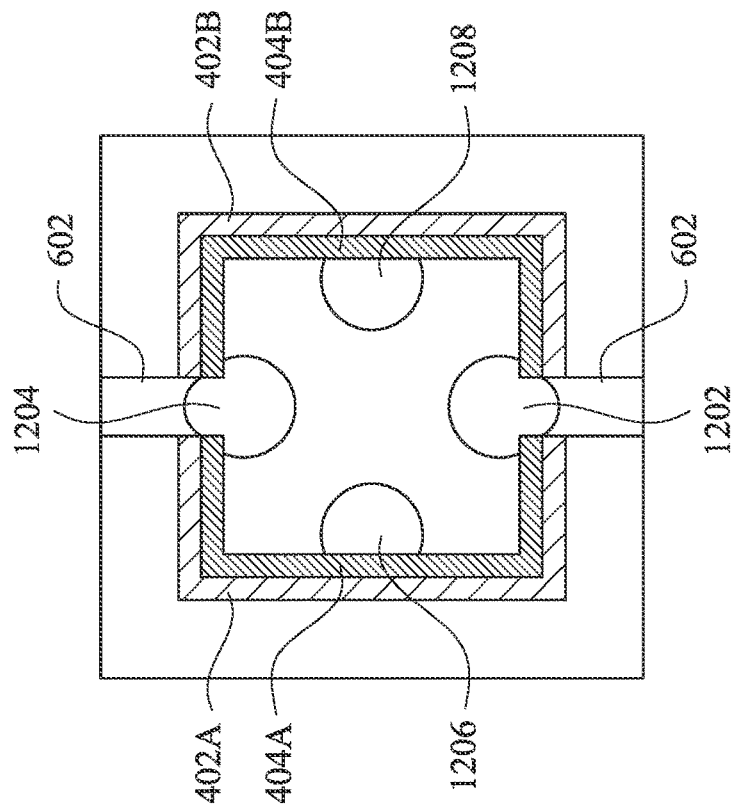
FIGS. 14A, 14B, 14C, and 14D each illustrate a cross-sectional view of the example three-dimensional memory device shown in FIGS. 2-12, in accordance with some other embodiments.
Figure 14A:
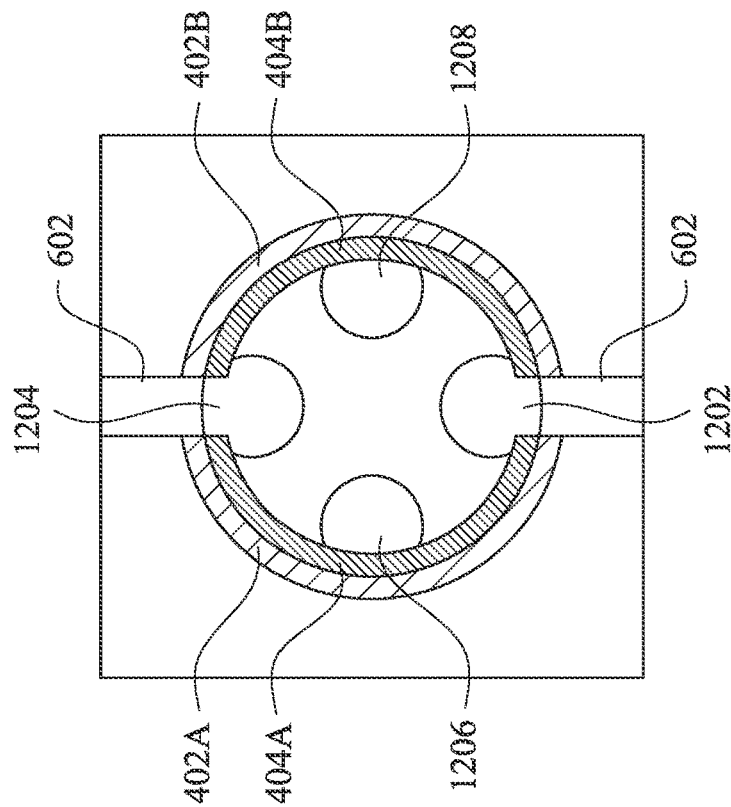

Referring first to FIG. 14A, prior to being cut, the memory layer 402 and channel layer 404 may each be formed in an oval shape. Subsequently to being cut (e.g., operation 108 of FIG. 1), the cut memory layers 402A and 402B can inherit the oval-based profile, with their respective ends open to be in contact with an insulating layer (e.g., 602). Similarly, the cut channel layers 404A and 404B can also inherit the oval-based profile, with their respective ends open to be in contact with a pair of BLs (e.g., 1202 and 1204). In the illustrated embodiment of FIG. 14A, each of the BLs 1202-1204 and each of the SLs 1206-1208 may be formed in a curvature-based shape, with one or more portions cut out by the cut channel layer 404A and/or 404B.

Referring next to FIG. 14B, prior to being cut, the memory layer 402 and channel layer 404 may each be formed in a polygon shape (e.g., a rectangle, a square). Subsequently to being cut (e.g., operation 108 of FIG. 1), the cut memory layers 402A and 402B can inherit the polygon-based profile, with their respective ends open to be in contact with an insulating layer (e.g., 602). Similarly, the cut channel layers 404A and 404B can also inherit the polygon-based profile, with their respective ends open to be in contact with a pair of BLs (e.g., 1202 and 1204). In the illustrated embodiment of FIG. 14B, each of the BLs 1202-1204 and each of the SLs 1206-1208 may be formed in a curvature-based shape, with one or more portions cut out by the cut channel layer 404A and/or 404B.

Figure 14D:
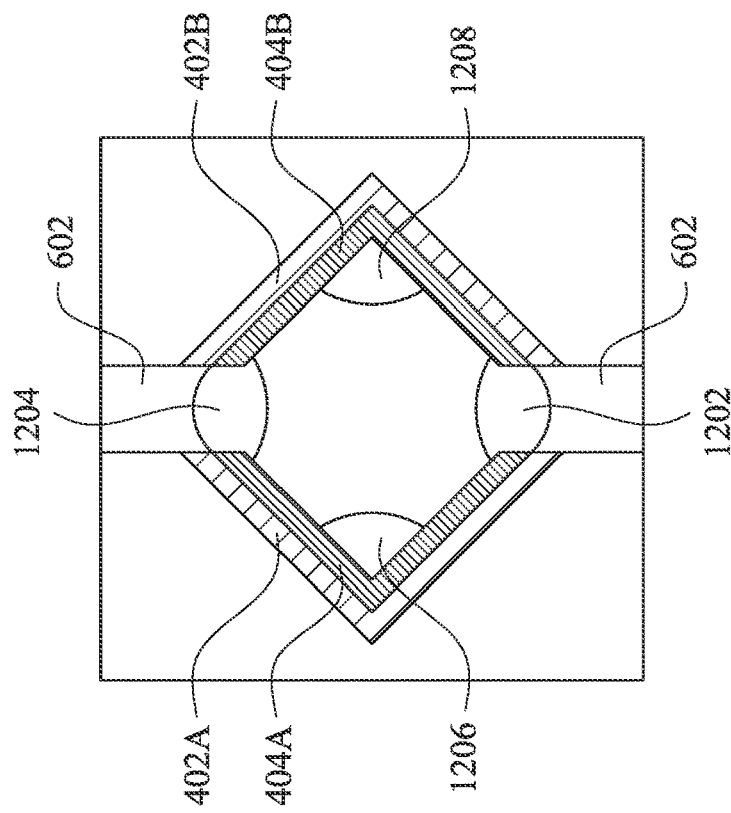
Figure 14C:
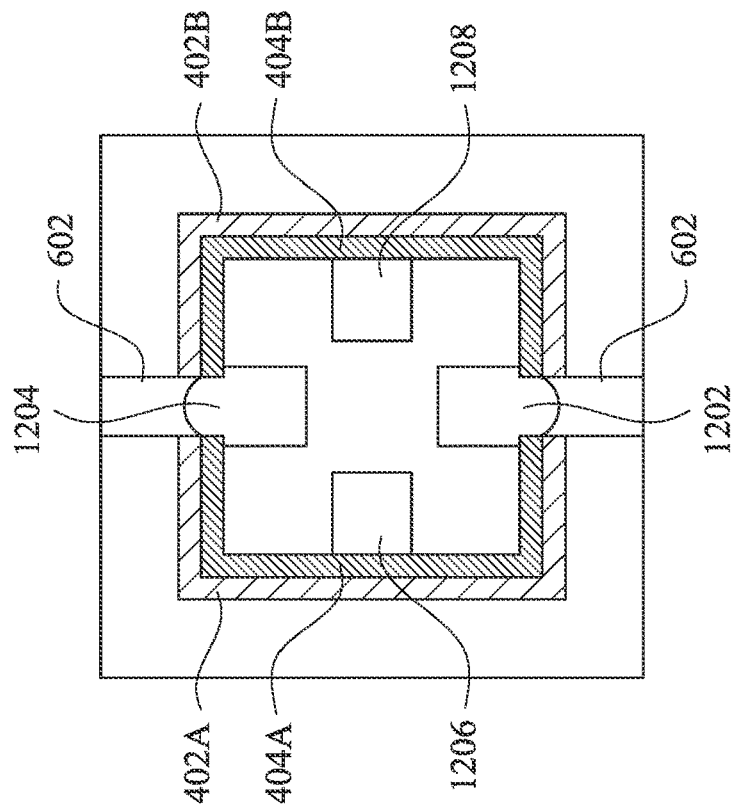

Still next, in FIG. 14C, prior to being cut, the memory layer 402 and channel layer 404 may each be formed in a polygon shape (e.g., a rectangle, a square). Subsequently to being cut (e.g., operation 108 of FIG. 1), the cut memory layers 402A and 402B can inherit the polygon-based profile, with their respective ends open to be in contact with an insulating layer (e.g., 602). Similarly, the cut channel layers 404A and 404B can also inherit the polygon-based profile, with their respective ends open to be in contact with a pair of BLs (e.g., 1202 and 1204). In the illustrated embodiment of FIG. 14C, each of the BLs 1202-1204 and each of the SLs 1206-1208 may be formed in a polygon-based shape, with one or more portions cut out by the cut channel layer 404A and/or 404B.

Referring then to FIG. 14D, prior to being cut, the memory layer 402 and channel layer 404 may each be formed in a polygon shape (e.g., a rhombus). Subsequently to being cut (e.g., operation 108 of FIG. 1), the cut memory layers 402A and 402B can inherit the polygon-based profile, with their respective ends open to be in contact with an insulating layer (e.g., 602). Similarly, the cut channel layers 404A and 404B can also inherit the polygon-based profile, with their respective ends open to be in contact with a pair of BLs (e.g., 1202 and 1204). In the illustrated embodiment of FIG. 14D, each of the BLs 1202-1204 and each of the SLs 1206-1208 may be formed in a curvature-based shape, with one or more portions cut out by the cut channel layer 404A and/or 404B.

In one aspect of the present disclosure, a semiconductor device is disclosed. The semiconductor device includes a first conductor structure extending along a lateral direction. The semiconductor device includes a first memory film extending along a vertical direction. The first memory film is in contact with the first conductor structure. The semiconductor device includes a first semiconductor film extending along the vertical direction. The first semiconductor film is in contact with the first memory film, and ends of the first semiconductor film align with ends of the first memory film, respectively. The semiconductor device includes a second conductor structure extending along the vertical direction. The semiconductor device includes a third conductor structure extending along the vertical direction. The semiconductor device includes a fourth conductor structure extending along the vertical direction. The second and fourth conductor structures are coupled to the ends of the first semiconductor film, and the third conductor structure is coupled to a portion of the first semiconductor film between its ends.

In another aspect of the present disclosure, a memory device is disclosed. The memory device includes a first memory cell, a second memory cell, a third memory cell, and a fourth memory cell. The first memory cell includes a first portion of a first memory film and a first portion of a first semiconductor film, the first memory film and the first semiconductor film extending along a vertical direction. The second memory cell includes a second portion of the first memory film and a second portion of the first semiconductor film. The third memory cell includes a first portion of a second memory film and a first portion of a second semiconductor film, the second memory film and the second semiconductor film extending along the vertical direction. The fourth memory cell includes a second portion of the second memory film and a second portion of the second semiconductor film.

In yet another aspect of the present disclosure, a method for fabricating memory devices is disclosed. The method includes forming a closed-end memory layer extending through a stack of a plurality of insulating layers and a plurality of sacrificial layers. The insulating layers and the sacrificial layers are alternatively arranged on top of one another. The method includes forming a closed-end semiconductor layer extending through the stack. The semiconductor layer is in contact with the memory layer. The method includes separating the memory layer into a first portion and a second portion. The method includes separating the semiconductor layer into a first portion and a second portion. The method includes forming a first interconnect structure, second interconnect structure, third interconnect structure, and fourth interconnect structure. Each of the first through fourth interconnect structures extends through the stack. The first and third interconnect structures are coupled to ends of the first portion of the semiconductor layer, with the second interconnect structure coupled to a midpoint of the first portion of the semiconductor layer. The first and third interconnect structures are coupled to ends of the second portion of the semiconductor layer, with the fourth interconnect structure coupled to a midpoint of the second portion of the semiconductor layer.

In yet another aspect still of the present disclosure, a method for fabricating memory devices is disclosed. The method includes forming a stack of a plurality of insulating layers and a plurality of other layers, the insulating layers and the other layers alternatively arranged on top of one another. The method includes etching a first columnar recess vertically through the stack. The method includes forming a memory layer along an inner cavity of the first columnar recess. The method includes forming a semiconductor layer along the memory layer. The method includes electrically isolating a first portion of the stack from a second portion of the stack. The first portion of the stack includes a first portion of the memory layer. The first portion of the stack includes a first portion of the semiconductor layer. The second portion of the stack includes a second portion of the memory layer. The second portion of the stack includes a second portion of the semiconductor layer. The method includes forming a second columnar recess, a third columnar recess, a fourth columnar recess, and a fifth columnar recess, each abutting the semiconductor layer.

In a further aspect of the present disclosure, a method for fabricating memory devices is disclosed. The method includes forming a plurality of first columnar recesses extending through a stack of a plurality of dielectric layers. The method includes forming a first blanket layer along the plurality of first columnar recesses. The method includes forming a second blanket layer along the plurality of first columnar recesses. The method includes bisecting the plurality of first columnar recesses to separate a first portion of each of the first blanket layer and the second blanket layer from a second portion of each of the first blanket layer and the second blanket layer. The method includes forming, corresponding to each of the plurality of first columnar recesses, a second columnar recess, a third columnar recess, a fourth columnar recess, and a fifth columnar recess, wherein each of the second columnar recess, the third columnar recess, the fourth columnar recess, and the fifth columnar recess, abut the second blanket layer. The method includes forming a first bit line in the second columnar recesses. The method includes forming a second bit line in the third columnar recesses. The method includes forming a select line comprising an electrical connection between a first conductive material in the fourth columnar recesses and the fifth columnar recesses.\

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating memory devices, comprising:
   forming a closed-end memory layer extending through a stack of a plurality of insulating layers and a plurality of sacrificial layers, the insulating layers and the sacrificial layers alternatively arranged on top of one another;
   forming a closed-end semiconductor layer extending through the stack, the semiconductor layer in contact with the memory layer;
   separating the memory layer into a first portion and a second portion;
   separating the semiconductor layer into a first portion and a second portion; and
   forming a first interconnect structure, second interconnect structure, third interconnect structure, and fourth interconnect structure, each of the first through fourth interconnect structures extending through the stack.

2. The method of claim 1, further comprising:
   replacing the plurality of sacrificial layers with a plurality of fifth interconnect structures.

3. The method of claim 2, wherein a first subgroup of the plurality of fifth interconnect structures are electrically coupled to the first portion of the semiconductor layer through the first portion of the memory layer, and a second subgroup of the plurality of fifth interconnect structures are electrically coupled to the second portion of the semiconductor layer through the second portion of the memory layer.

4. The method of claim 1, wherein the step of separating the memory layer and the step of separating the semiconductor layer further comprises forming a dielectric film extending through the stack, wherein the first subgroup of fifth interconnect structures and second subgroup of fifth interconnect structures are electrically isolated by the dielectric film.

5. The method of claim 1, wherein the first and third interconnect structures are coupled to ends of the first portion of the semiconductor layer, with the second interconnect structure coupled to a midpoint of the first portion of the semiconductor layer.

6. The method of claim 5, wherein the first and third interconnect structures are coupled to ends of the second portion of the semiconductor layer, with the fourth interconnect structure coupled to a midpoint of the second portion of the semiconductor layer.

7. The method of claim 1, wherein the memory layer comprises Hafnium Dioxide ($HfO_2$), Hafnium Zirconium Oxide ($Hr_{1-x}Zr_xO_2$), Zirconium Dioxide ($ZrO_2$), Titanium Dioxide ($TiO_2$), Nickel Oxide (NiO), Tantalum Oxide ($TaO_x$), Copper(I) Oxide ($Cu_2O$), Niobium Pentoxide ($Nb_2O_5$), or Aluminum Oxide ($AlO_x$).

8. A method for fabricating memory devices, comprising:
   forming a stack of a plurality of insulating layers and a plurality of other layers, the insulating layers and the other layers alternatively arranged on top of one another;
   etching a first columnar recess vertically through the stack;
   forming a memory layer along an inner cavity of the first columnar recess;
   forming a semiconductor layer along the memory layer;
   electrically isolating a first portion of the stack from a second portion of the stack, the first portion of the stack comprising a first portion of the memory layer and a first portion of the semiconductor layer; and the second portion of the stack comprising a second portion of the memory layer and a second portion of the semiconductor layer; and
   forming a second columnar recess, a third columnar recess, a fourth columnar recess, and a fifth columnar recess, wherein each of the second columnar recess, the third columnar recess, the fourth columnar recess, and the fifth columnar recess, abut the semiconductor layer.

9. The method of claim 8, wherein electrically isolating the first portion of the stack from the second portion of the stack comprises:
   forming a trench bisecting the first columnar recess; and
   filling the trench with a dielectric material.

10. The method of claim 9, wherein the dielectric material and the plurality of insulating layers comprise a same material.

11. The method of claim 8, further comprising:
    removing the plurality of other layers, the plurality of other layers comprising a plurality of sacrificial layers;
    replacing the plurality of sacrificial layers with a plurality of conductive layers; and
    filling the second columnar recess, the third columnar recess, the fourth columnar recess, and the fifth columnar recess to form a respective first interconnect structure, second interconnect structure, third interconnect structure, and fourth interconnect structure, each of the first interconnect structure, the second interconnect structure, the third interconnect structure, and the fourth interconnect structure coupling to the semiconductor layer.

12. The method of claim 11, wherein:
    the first and third interconnect structures are coupled to the first portion of the semiconductor layer and the second portion of the semiconductor layer;
    the second interconnect structure is coupled to the first portion of the semiconductor layer; and
    the fourth interconnect structure is coupled to the first portion of the semiconductor layer.

13. The method of claim 11, wherein:
    the first portion of the stack is a mirrored image of the second portion of the stack across a lateral axis;
    the second interconnect structure is a mirrored image of the second portion of the stack across the lateral axis; and the second interconnect structure is disposed at a midpoint, along the lateral axis, of the first portion.

14. The method of claim 8, wherein the first columnar recess is formed having a continuously curved surface.

15. The method of claim 8, wherein forming the second columnar recess, the third columnar recess, the fourth columnar recess, and the fifth columnar recess comprises:
filling the first columnar recess with a dielectric material; and
etching vertically through the dielectric material.

16. A method for fabricating memory devices, comprising:
forming a plurality of first columnar recesses extending through a stack of a plurality of dielectric layers;
forming a first blanket layer along the plurality of first columnar recesses;
forming a second blanket layer along the plurality of first columnar recesses;
bisecting the plurality of first columnar recesses to separate a first portion of each of the first blanket layer and the second blanket layer from a second portion of each of the first blanket layer and the second blanket layer;
forming, corresponding to each of the plurality of first columnar recesses, a second columnar recess, a third columnar recess, a fourth columnar recess, and a fifth columnar recess, wherein each of the second columnar recess, the third columnar recess, the fourth columnar recess, and the fifth columnar recess, abut the second blanket layer; and
forming a first bit line in the second columnar recesses, a second bit line in the third columnar recesses, and a select line comprising an electrical connection between a first conductive material in the fourth columnar recesses and the fifth columnar recesses.

17. The method of claim 16, wherein the plurality of dielectric layers are separated by a plurality of sacrificial layers, and further comprising:
removing the plurality of sacrificial layers to form inter-layer recesses; and
filling the plurality of inter-layer recesses with a second conductive material to form a plurality of word lines.

18. The method of claim 16, further comprising horizontally etching the plurality of dielectric layers prior to filling each of the second columnar recesses, the third columnar recesses, the fourth columnar recesses, and the fifth columnar recesses.

19. The method of claim 17, wherein the first conductive material and the second conductive material comprise a same metal.

20. The method of claim 16, wherein the first blanket layer comprises Hafnium Dioxide ($HfO_2$), Hafnium Zirconium Oxide ($Hr_{1-x}Zr_xO_2$), Zirconium Dioxide ($ZrO_2$), Titanium Dioxide ($TiO_2$), Nickel Oxide (NiO), Tantalum Oxide ($TaO_x$), Copper(I) Oxide ($Cu_2O$), Niobium Pentoxide ($Nb_2O_5$), or Aluminum Oxide ($AlO_x$).

* * * * *